(12) United States Patent
Hirose

(10) Patent No.: US 6,759,744 B2
(45) Date of Patent: Jul. 6, 2004

(54) ELECTRONIC CIRCUIT UNIT SUITABLE FOR MINIATURIZATION

(75) Inventor: Yoshitaka Hirose, Fukushima-ken (JP)

(73) Assignee: Alps Electric Co., Ltd. (JP)

( * ) Notice: Subject to any disclaimer, the term of this patent is extended or adjusted under 35 U.S.C. 154(b) by 34 days.

(21) Appl. No.: 10/267,720

(22) Filed: Oct. 9, 2002

(65) Prior Publication Data

US 2003/0071349 A1 Apr. 17, 2003

(30) Foreign Application Priority Data

Oct. 11, 2001 (JP) ........................................ 2001-314243

(51) Int. Cl.[7] .............................................. H01L 23/34
(52) U.S. Cl. ....................... 257/728; 257/275; 257/277; 257/482; 257/604; 257/737
(58) Field of Search ................. 257/199, 259, 257/275–277, 482, 523, 604, 624, 625, 659, 662, 664, 728

(56) References Cited

U.S. PATENT DOCUMENTS 5,459,368 A * 10/1995 Onishi et al. ............... 310/313
5,821,627 A * 10/1998 Mori et al. .................. 257/780
6,238,951 B1 * 5/2001 Caillat ......................... 438/108
6,263,193 B1 * 7/2001 Iseki et al. .................... 455/84
6,396,116 B1 * 5/2002 Kelly et al. .................. 257/432
6,400,019 B1 * 6/2002 Hirashima et al. .......... 257/737
6,521,483 B1 * 2/2003 Hashimoto .................. 438/110

FOREIGN PATENT DOCUMENTS

JP          08-274575          10/1996

* cited by examiner

Primary Examiner—David Nelms
Assistant Examiner—Andy Huynh
(74) Attorney, Agent, or Firm—Brinks Hofer Gilson & Lione

(57) ABSTRACT

The electronic circuit unit of the present invention includes first and second insulating substrates on respective surfaces of which wiring patterns are formed, and thick-film passive elements formed on the surfaces of the first and second insulating substrates in a state in which they are connected to the wiring patterns, wherein the first and second insulating substrates are disposed vertically opposite to each other, and the wiring patterns provided on the first and second insulating substrates are connected through metallic bumps provided between the first and second insulating substrates.

18 Claims, 3 Drawing Sheets

ELECTRONIC CIRCUIT UNIT SUITABLE FOR MINIATURIZATION

BACKGROUND OF THE INVENTION

1. Field of the Invention

The present invention relates to an electronic circuit unit suitably applied to a transmitting-receiving unit of a cellular phone.

2. Description of the Prior Art

A conventional electronic circuit unit, e.g., a transmitting-receiving unit, has one insulating substrate on which a wiring pattern is provided, on which passive elements such as a chip resistor and a capacitor, and active elements and the like comprising ICs are mounted to form an RF circuit and a base band circuit.

Since a conventional electronic circuit unit is configured with one insulating substrate, it becomes large in a width direction, posing the problem that miniaturization in a width direction cannot be achieved.

Another problem is that passive elements are difficult to make electric adjustments to because of use of chips, and variations in electric accuracy of the chips reduce electric performance capabilities and yields in manufacturing processes.

SUMMARY OF THE INVENTION

An object of the present invention is to provide an electronic circuit unit that can be miniaturized in a width direction and has excellent electric performance capabilities.

As a first solving means for solving the above problems, an electronic circuit unit of the present invention includes first and second insulating substrates on the respective surfaces of which wiring patterns are formed, and thick-film or thin-film passive elements formed on the surfaces of the first and second insulating substrates in a state in which they are connected to the wiring patterns, wherein the first and second insulating substrates are disposed vertically opposite to each other, and the wiring patterns provided on the first and second insulating substrates are connected through metallic bumps provided between the first and second insulating substrates.

As a second solving means, active elements comprising ICs, connected to the wiring patterns, are disposed on the first and second insulating substrates, respectively.

As a third means, first and second electric circuits including the passive element and the active element are formed on the first and second insulating substrates, respectively.

As a fourth means, the first electric circuit is configured with an RF circuit and the second electric circuit is configured with a base band circuit.

As a fifth solving means, the active elements include the first and second active elements, the first insulating substrate on which the first active element is disposed is provided with a hole, and the second active element disposed on the surface of the second insulating substrate is disposed within the hole.

As a sixth solving means, the first active element is disposed on the first insulating substrate in such a manner as to cover the hole.

As a seventh solving means, the respective surfaces of the first and second insulating substrates are provided with concave positioning parts for positioning the bumps.

As an eighth means, the positioning parts are formed by through holes provided on the insulating substrates, and the spherical bumps are positioned in the positioning parts.

As a ninth solving means, the positioning parts are formed by the conical, concaves provided on the insulating substrates, and the spherical bumps are positioned in the positioning parts.

DESCRIPTION OF THE PREFERRED EMBODIMENTS

Figure 1:
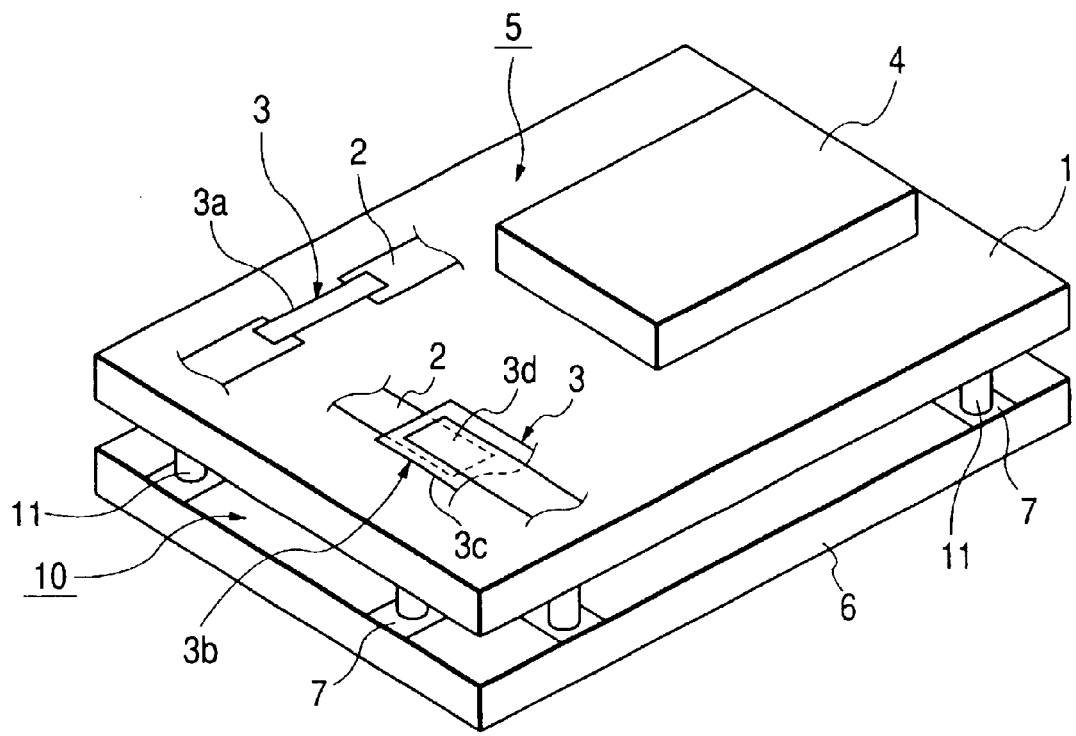
FIG. 1 is a perspective view relating to a first embodiment of an electronic circuit unit of the present invention.
Figure 2:
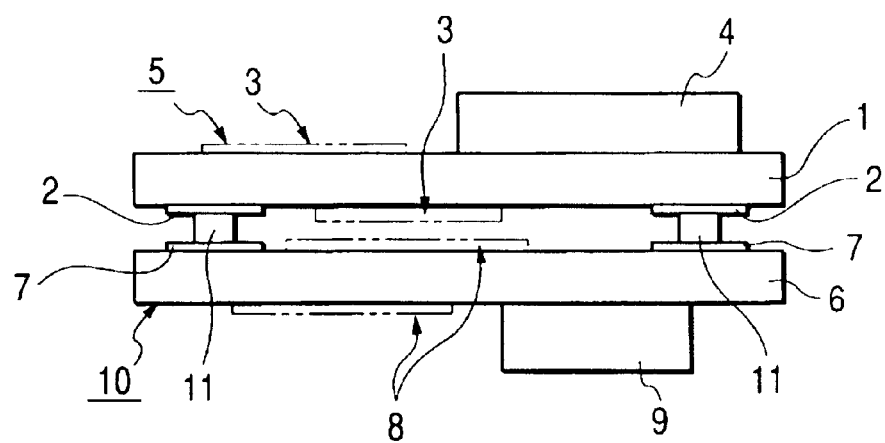
FIG. 2 is a side view relating to the first embodiment of the electronic circuit unit of the present invention.
Figure 3:
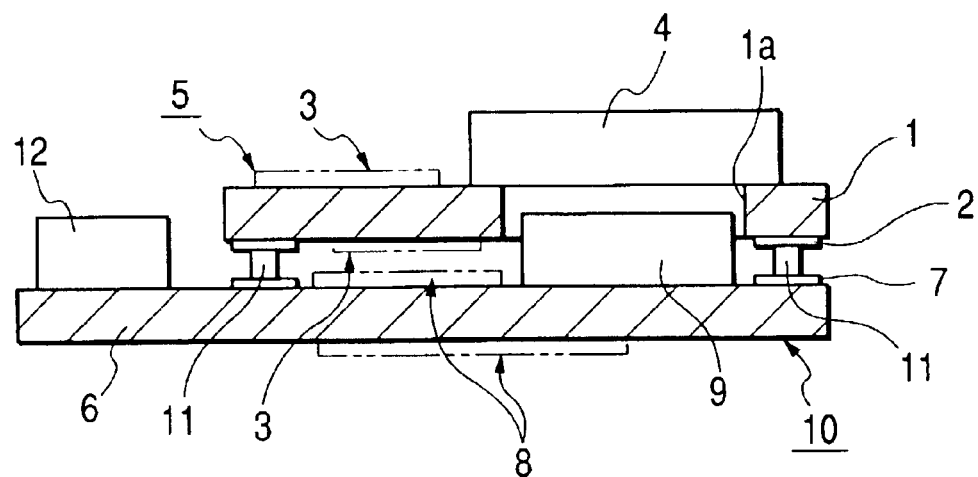
FIG. 3 is a sectional view of a main portion relating to a second embodiment of the electronic circuit unit of the present invention.
Figure 4:
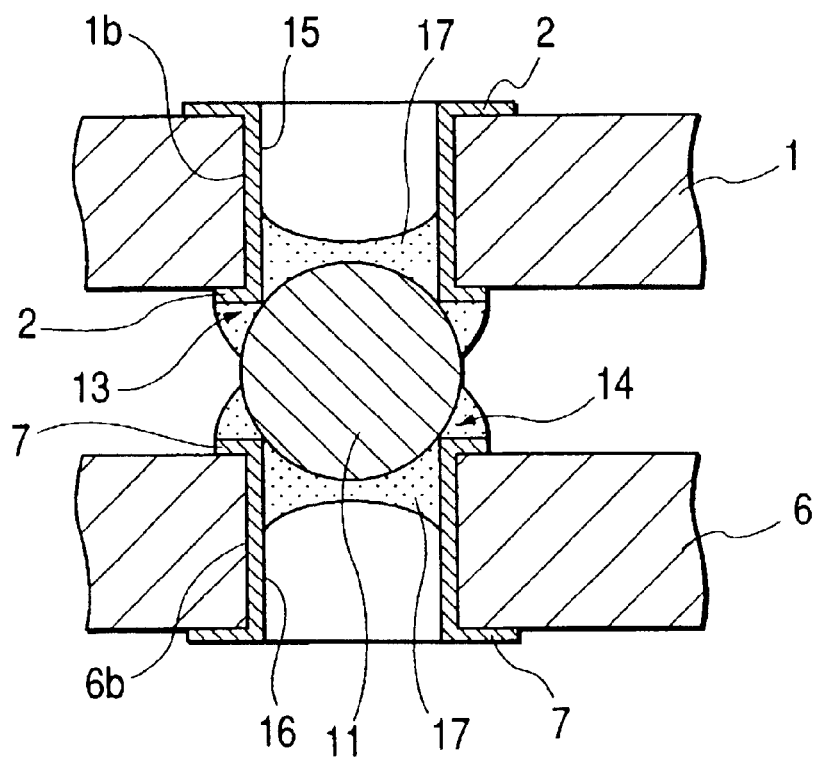
FIG. 4 is an enlarged sectional view of a main portion showing a bump configuration in a third embodiment of the electronic circuit unit of the present invention.
Figure 5:
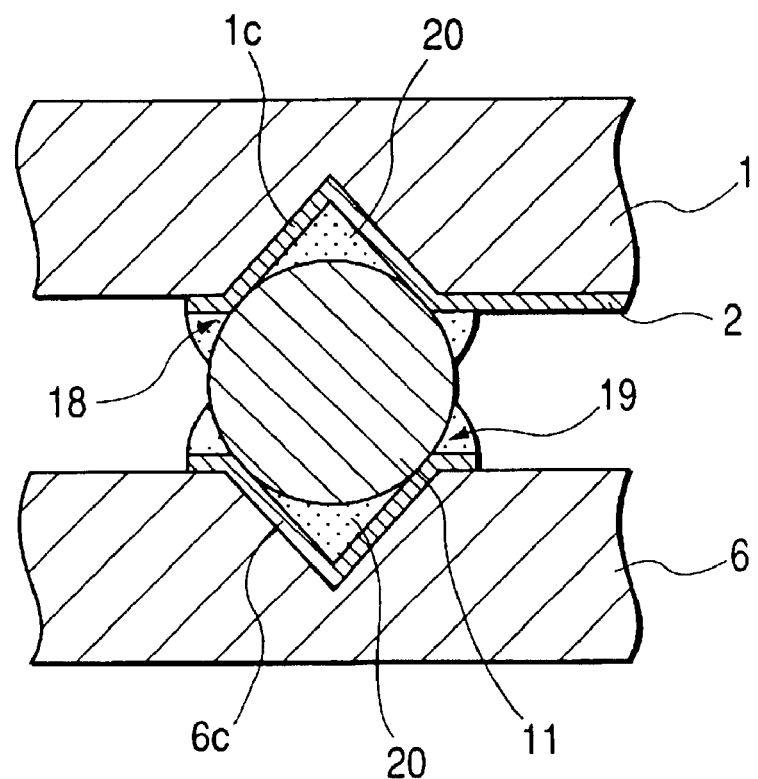
FIG. 5 is an enlarged sectional view of a main portion showing a bump configuration in a fourth embodiment of the electronic circuit unit of the present invention.

Drawings of an electronic circuit unit of the present invention are described. FIG. 1 is a perspective view relating to a first embodiment of an electronic circuit unit of the present invention. FIG. 2 is a side view relating to the first embodiment of the electronic circuit unit of the present invention. FIG. 3 is a sectional view of a main portion relating to a second embodiment of the electronic circuit unit of the present invention. FIG. 4 is an enlarged sectional view of a main portion showing a bump configuration in a third embodiment of the electronic circuit unit of the present invention. FIG. 5 is an enlarged sectional view of a main portion showing a bump configuration in a fourth embodiment of the electronic circuit unit of the present invention.

Next, the configuration of the first embodiment of the electronic circuit unit of the present invention is described based on FIGS. 1 and 2. An insulating substrate 1 is made up of a ceramic substrate or the like having one layer or plural layers stacked on top of each other. On the upper and lower surfaces of the insulating substrate 1 are provided thick-film wiring patterns 2 made of a conductive material, formed by printing or the like.

On the upper surface of the insulating substrate 1 are formed a thick-film passive element 3 made up of a resistor, a capacitor, and the like, and on the lower surface of the insulating substrate 1 are formed a thick-film or thin-film passive elements 3 made up of a resistor, a capacitor, and the like.

While being connected to the wiring pattern 2, a resistor 3a, which is a passive element 3, is formed on the surface of the insulating substrate 1 by printing or the like. A capacitor 3b, which is a passive element 3, is formed on the surface of the insulating substrate 1 in a state in which two opposite electrodes 3d are connected to the wiring pattern 2 by printing or the like through a dielectric 3c formed by printing or the like.

On the upper face of the insulating substrate 1, a first active element 4 made up of semiconductor ICs is disposed connected to the wiring pattern 2.

The wiring patterns 2 provided on the upper and lower faces of the insulating substrate 1 are connected by connection conductors (not shown) filled in through holes provided in proper locations of the insulating substrate 1, and at least a main portion of a first electric circuit 5, which is an RF circuit, is formed on the insulating substrate 1.

An insulating substrate 6 is made up of a ceramic substrate or the like having one layer or plural layers stacked on top of each other. On the upper and lower surfaces of the insulating substrate 6 are provided thick-film wiring patterns 7 made of a conductive material, formed by printing or the like.

On the upper and lower surfaces of the insulating substrate 6, thick-film passive elements 8 made up of a resistor, a capacitor, and the like are formed connected to the wiring patterns 7.

On the lower face of the insulating substrate 6, a second active element 9 made up of semiconductor ICs is disposed connected to the wiring patterns 7.

The wiring patterns 7 provided on the upper and lower faces of the insulating substrate 6 are connected by connection conductors (not shown) filled in through holes provided in proper locations of the insulating substrate 6, and at least a main portion of a second electric circuit 10, which is a base band circuit, is formed on the insulating substrate 6.

The first and second insulating substrates 1 and 6 on which the first and second electric circuit 5 and 10 are formed are disposed vertically opposite to each other, with the first insulating substrate 1 over the second insulating substrate 6. The wiring patterns 2 and 7 are electrically connected through metallic bumps 11 disposed between the first and second insulating substrates 1 and 6.

The bumps 11 are disposed in plural locations between the first and second insulating substrates 1 and 6, whereby the first and second electric circuits 5 and 10 are connected and the first and second insulating substrates 1 and 6 are combined, forming the electronic circuit unit of the present invention.

Before the first and second insulating substrates 1 and 6 are combined, they are individually subjected to electric inspection, at which time the thick-film passive elements 3 and 8 are trimmed for adjustment, whereby the first and second electronic circuits 5 and 10 are adjusted to have desired electric performance capabilities.

The passive elements 3 and 8 may be a thick-film or thin-film strip line made of a conductive material.

The active elements 4 and 9 may be mounted on any one of the first and second insulating substrates 1 and 6.

FIG. 3 shows a second embodiment of the electronic circuit unit of the present invention. In the second embodiment, a hole 1a is provided on the first insulating substrate 1 so that the second active element 9 disposed on the upper face of the second insulating substrate 6 fits in the hole 1a and the first active element 4 disposed on the upper face of the first insulating substrate 1 covers the hole 1a.

Furthermore, a second insulating substrate 10 disposed vertically opposite to the first insulating substrate 1 is formed to be larger than the first insulating substrate 1, and protrudes at one end thereof from an end of the first insulating substrate 1. In the protrusion, an electric part 12 such as a switch or filter is mounted connected to the wiring pattern.

In other portions, the electronic circuit unit of the second embodiment has the same configuration as that of the first embodiment, and identical reference numerals are assigned to identical parts, the description of which is omitted here.

FIG. 4 shows a third embodiment of the electronic circuit unit of the present invention. In the third embodiment, in the surfaces of the first and second insulating substrates 1 and 6, concave positioning parts 13 and 14 formed of through holes 1b and 6b are provided.

Connection conductors 15 and 16 connecting the wiring patterns 2 and 7 provided on the upper and lower faces of the respective first and second insulating substrates 1 and 6 are filled in the through holes 1b and 6b, respectively. The spherical bump 11 is positioned in the positioning parts 13 and 14, and soldered (17) to the wiring patterns 2 and 7, and the connection conductors 15 and 16 so that the wiring patterns 2 and 7 are connected through the spherical bump 11.

FIG. 5 shows a fourth embodiment of the electronic circuit unit of the present invention. In the fourth embodiment, in the surfaces of the first and second insulating substrates 1 and 6, concave positioning parts 18 and 19 formed of conical, concaves 1c and 6c are provided.

The wiring patterns 2 and 7 provided on the respective first and second insulating substrates 1 and 6 are elongated to the concaves 1c and 6c, respectively, and the spherical bump 11 is positioned in the positioning parts 18 and 19 and soldered (20) to the wiring patterns 2 and 7 so that the wiring patterns 2 and 7 are connected through the spherical bump 11.

The electronic circuit unit of the present invention includes the first and second insulating substrates 1 and 6 on the respective surfaces of which the wiring patterns 2 and 7 are formed, and the thick-film or thin-film passive elements 3 and 8 formed on the surfaces of the first and second insulating substrates 1 and 6 in a state in which they are connected to the wiring patterns 2 and 7, wherein the first and second insulating substrates 1 and 6 are disposed vertically opposite to each other, and the wiring patterns 2 and 7 provided on the first and second insulating substrates 1 and 6 are connected through the metallic bumps 11 provided between the first and second insulating substrates 1 and 6. With this construction, since the first and second insulating substrates 1 and 6 can be disposed vertically, a small-sized electronic circuit unit can be provided which is smaller in width direction than conventional ones.

Also, since the thick-film passive elements 3 and 8 are provided on the surfaces of the first and second insulating substrates 1 and 6, they can be easily adjusted and a high-performance electronic circuit unit can be provided.

Also, since the first and second insulating substrates 1 and 6 are combined by the bumps 11, they can be disposed in close proximity to each other and a small-sized, easy-to-combine electronic circuit unit can be provided.

Since the active elements 4 and 8 made up of ICs, connected to the wiring patterns 2 and 7, are disposed on the first and second insulating substrates 1 and 6, respectively, main portions different from each other in circuit can be separately formed and a high-yield electronic circuit unit can be produced.

Since the first and second electric circuits 5 and 10 including a passive element and an active element are formed on the first and second insulating substrates 1 and 6, respectively, main portions different from each other in circuit can be separately formed and a high-yield electronic circuit unit can be produced.

Since the first electric circuit 5 is configured with an RF circuit and the second electric circuit 10 is configured with a base band circuit, an electronic circuit unit suitably applied to a transmitting-receiving unit of a cellular phone can be provided.

The active elements include the first and second active elements 4 and 9, the first insulating substrate 1 on which the first active element 4 is disposed is provided with a hole 1a, and the second active element 9 disposed on the surface of the second insulating substrate 6 is disposed within the hole 1a. With this construction, a vertical height can be reduced, so that a small-sized electronic circuit unit can be provided.

Since the first active element 4 is disposed on the first insulating substrate 1 in such a manner as to cover the hole 1a, the surface of the first insulating substrate 1 occupied by the first active element 4 can be reduced and space for the parts on the first insulating substrate 1 can be enlarged.

Since the respective surfaces of the first and second insulating substrates 1 and 6 are provided with concave positioning parts for positioning the bumps 11, the bumps 11 are securely positioned, and the first and second insulating substrates 1 and 6 are securely combined and wired.

The positioning parts 13 and 14 are formed by the through holes 1b and 6b provided on the insulating substrates 1 and 6, and the spherical bumps 11 are positioned in the positioning parts 13 and 14. As a result, the construction is simplified, and the bumps 11 are securely positioned, and the first and second insulating substrates 1 and 6 are securely combined and wired.

The positioning parts 18 and 19 are formed by the conical concaves 1c and 6c provided on the insulating substrates 1 and 6, and the spherical bumps 11 are positioned in the positioning parts 18 and 19. As a result, the construction is simplified, and the bumps 11 are securely positioned, and the first and second insulating substrates 1 and 6 are securely combined and wired.

What is claimed is:

1. An electronic circuit unit comprising:
   first and second insulating substrates on respective surfaces of which wiring patterns are formed; end
   one of thick-film and thin-film passive elements as well as first and second active elements comprising ICs formed on the surfaces of the first and second insulating substrates and connected to the wiring patterns,
   wherein the first and second insulating substrates are disposed vertically opposite to each other, wherein the first insulating substrate on which the first active element is disposed is provided with a hole, wherein the second active element disposed on the surface of the second insulating substrate is disposed within the hole, and wherein the wiring patterns provided on the first and second insulating substrates are connected through metallic bumps provided between the first and second insulating substrates.

2. The electronic circuit unit according to claim 1, wherein first and second electric circuits including the passive element and the active element are formed on the first and second insulating substrates, respectively, and wherein the first electric circuit is configured with an RF circuit and the second electric circuit is configured with a base band circuit.

3. The electronic circuit unit according to claim 2, wherein the respective surfaces of the first and second insulating substrates are provided with concave positioning parts for positioning the bumps.

4. The electronic circuit unit according to claim 3, wherein the positioning parts are formed by through holes provided on the insulating substrates, and wherein the spherical bumps are positioned in the positioning parts.

5. The electronic circuit unit according to claim 3, wherein the positioning ports are formed by conical concaves provided on the insulating substrates, and wherein the spherical bumps are positioned in the positioning parts.

6. The electronic circuit unit according to claim 1, wherein the first active element is disposed on the first insulating substrate to cover the hole.

7. The electronic circuit unit according to claim 6, wherein the respective surfaces of the first and second insulating substrates are provided with concave positioning parts for positioning the bumps.

8. The electronic circuit unit according to claim 7, wherein the positioning parts are formed by through holes provided on the insulating substrates, and wherein the spherical bumps are positioned in the positioning parts.

9. The electronic circuit unit according to claim 7, wherein the positioning parts are formed by conical concaves provided on the insulating substrates, and wherein the spherical bumps are positioned in the positioning parts.

10. The electronic circuit unit according to claim 1, wherein the respective surfaces of the first and second insulating substrates are provided with concave positioning parts for positioning the bumps.

11. The electronic circuit unit according to claim 10, wherein the positioning parts are formed by through holes provided on the insulating substrates, and wherein the spherical bumps ore positioned in the positioning parts.

12. The electronic circuit unit according to claim 10, wherein the positioning parts ore formed by conical concaves provided on the insulating substrates, and wherein the spherical bumps are positioned in the positioning parts.

13. An electronic circuit unit comprising:
    first and second insulating substrates on respective surfaces of which wiring patterns are formed; and
    one of thick-film and thin-film passive elements formed on the surfaces of the first and second insulating substrates and connected to the wiring patterns,
    wherein the first and second insulating substrates are disposed vertically opposite to each other, the wiling patterns provided on the first and second insulating substrates are connected through metallic bumps provided between the first and second insulating substrates, and the respective surfaces of the first and second insulating substrates are provided with concave positioning parts for positioning the bumps.

14. The electronic circuit unit according to claim 13, wherein active elements comprising ICs, connected to the wiring patterns, are disposed on the first and second insulating substrates, respectively.

15. The electronic circuit unit according to claim 14, wherein first and second electric circuits including the passive element and the active element are formed on the first and second insulating substrates, respectively, and wherein the first electric circuit is configured with an RF circuit and the second electric circuit is configured with a base band circuit.

16. The electronic circuit unit according to claim 13, wherein a first active element is disposed on the first insulating substrate to cover a hole in the first insulating substrate.

17. The electronic circuit unit according to claim 13, wherein the positioning parts are formed by through holes provided on the insulating substrates, and wherein the spherical bumps are positioned in the positioning parts.

18. The electronic circuit unit according to claim 13, wherein the positioning parts are formed by conical concaves provided an the insulating substrates, and wherein the spherical bumps are positioned in the positioning parts.

* * * * *

UNITED STATES PATENT AND TRADEMARK OFFICE
CERTIFICATE OF CORRECTION

PATENT NO. : 6,759,744 B2  Page 1 of 1
DATED : July 6, 2004
INVENTOR(S) : Yoshitaka Hirose It is certified that error appears in the above-identified patent and that said Letters Patent is hereby corrected as shown below:

Column 6,
Line 22, after "bumps" delete "ore" and substitute -- are -- in its place.
Line 35, after "each other, the" delete "wiling" and substitute -- wiring -- in its place.
Line 64, after "provided" delete "an" and substitute -- on -- in its place.

Signed and Sealed this

First Day of February, 2005

JON W. DUDAS
*Director of the United States Patent and Trademark Office*